United States Patent
Ho

(10) Patent No.: US 6,240,152 B1
(45) Date of Patent: May 29, 2001

(54) APPARATUS AND METHOD FOR SWITCHING FREQUENCY MODES IN A PHASE LOCKED LOOP SYSTEM

(75) Inventor: Kenneth S. Ho, Cupertino, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/135,756

(22) Filed: Aug. 18, 1998

(51) Int. Cl.$^7$ .................................................. H03D 3/24

(52) U.S. Cl. ........................... 375/376; 709/400; 714/12

(58) Field of Search .................................... 375/354, 371, 375/373, 376; 709/400; 713/400; 714/12; 370/503

(56) References Cited

U.S. PATENT DOCUMENTS

| | | | |
|---|---|---|---|
| 4,847,876 | 7/1989 | Baumbach et al. | 375/113 |
| 4,872,073 | * 10/1989 | Fincher et al. | 360/51 |
| 5,015,970 | 5/1991 | Williams et al. | 331/11 |
| 6,104,251 | * 8/2000 | Ramey et al. | 331/14 |

OTHER PUBLICATIONS

Bhagwan and Roger, "A 1 GHz Dual–Loop Microprocessor PLL with Instant Frequency Shifting", *IEEE International Solid–State Circuits Conference*, pp. 336–337 (1997).

Fair and Bailey, "Clocking Design and Analysis for a 600MHz Alpha Microprocessor", *IEEE International Solid–State Circuits Conference*, pp. 398–3999 (1998).

Galton et al., "A ΔΣPLL for 14b 50kSample/s Frequency–to–Digital Conversion of a 10MHz FM Signal", *IEEE International Solid–State Circuits Conference*, pp. 366–367 (1998).

Kim et al., "A 640MB/s Bi–Directional Data Strobed, Double–Data–Rate SDRAM with a 40mW DLL Circuit for a 256MB Memory System", *IEEE International Solid–State Circuits Conference*, pp. 158–159 (1998).

Kukielka and Meyer, "A High–Frequency Temperature–Stable Monolithic VCO", *IEEE J. of Solid–State Circuits*, SC–16(6):639–647 (1981).

(List continued on next page.)

*Primary Examiner*—Stephen Chin
*Assistant Examiner*—Chieh M. Fan
(74) *Attorney, Agent, or Firm*—Pennie & Edmonds LLP

(57) ABSTRACT

A clock frequency mode switching system for a microprocessor comprising three frequency shifters, a phase-locked loop (PLL) circuit, a synchronizer, and a comparator. To switch frequency modes, a CPU provides a command signal to at least one of the frequency shifter circuits to change its frequency division ratio. The signal is detected by the comparator which compares the current frequency division ratio of each of the frequency shifters to the CPU frequency command signal for each frequency shifter. The comparator outputs a reload signal to the synchronizer circuit. The synchronizer circuit aligns the reload signal to the PLL output signal and selects the appropriate PLL circuit output cycles that the division ratio of each of the frequency shifters should be updated on. To maintain phase-lock the third frequency shifter division ratio is updated first. The third frequency shifter division ratio update signal is also timed so that the first new clock frequency cycle is aligned with the start of a reference clock cycle. The first and second frequency shifters are then updated after a delay based on the delay of the CPU clock distribution network, so that the PLL maintains phase lock between the reference signal and feedback signal inputs. The invention thus maintains phase lock while changing clock frequency operating modes which provides deterministic operation and avoids metastability. The invention further provides for rapid switching from a normal operating mode to a reduced frequency mode and back to normal.

19 Claims, 7 Drawing Sheets

OTHER PUBLICATIONS von Kaenel et al., "A 600 MHz CMOS PLL Microprocessor Clock Generator with a 1.2GHz VCO", *IEEE International Solid–State Circuits Conference*, pp. 396–397 (1998).

Lee et al., "A 622Mb/s CMOS Clock Recovery PLL with Time–Interleaved Phase Detector Array", *IEEE International Solid–State Circuits Conference*, pp. 198–199 (1996).

Wagemans et al., "A 3.5mW 2.5GHz Diversity Receiver and a 1.2mW 3.6GHz VCO in Silicon–On–Anything", *IEEE International Solid–State Circuits Conference*, pp. 250–251 (1998).

Walker et al., "A 2.488Gb/s Is–Bipolar Clock and Data Recovery IC with Robust Loss of Signal Detection", *IEEE International Solid–State Circuits Conference*, pp. 246–247 (1997).

Young et al., A 0.35 $\mu$m CMOS 3–880 MHz PLL N/2 Clock Multiplier and Distribution Network with Low Jitter for Microprocessors, *IEEE International Solid–State Circuits Conference*, pp. 330–335 (1997).

\* cited by examiner

APPARATUS AND METHOD FOR SWITCHING FREQUENCY MODES IN A PHASE LOCKED LOOP SYSTEM

FIELD OF THE INVENTION

This invention relates generally to circuits for controlling clock signals in microprocessors. More particularly, this invention relates to a circuit that rapidly changes between normal and reduced power clock frequency operating modes while maintaining phase lock.

BACKGROUND OF THE INVENTION

Microprocessors are operated in response to a system clock. The increase in microprocessor speeds and the simultaneous reduction in power supply voltages impose restrictions on the design of microprocessor system clocks. In addition to microprocessor speed and power supply constraints, there is a demand for increased system clock frequency shifting flexibility. The frequency of the system clock of a microprocessor may be shifted for testing purposes or to preserve power.

Phase-locked loop circuits are widely used in electronic systems. These circuits are used to generate an accurate replica of an incoming signal. For example, in a computer, a phase-locked loop is used by a microprocessor to generate an on-chip clock signal from an off-chip clock signal.

To conserve power, it is desirable to reduce a microprocessors clock frequency when it is not being used. In conventional computer systems phase-locked loop circuits lose phase lock when the microprocessor clock frequency is changed. This increases the amount of time required to switch between a power saving mode and normal operation. In addition, the loss of phase lock may cause a signal to violate timing requirements and thereby create a metastable state which can cause the microprocessor to malfunction.

In view of these and other problems of conventional microprocessor phase-locked loop systems, it would be highly desirable to provide a phase-locked loop system that maintains phase lock when clock frequencies are changed, enables rapid switching between normal operating modes and power saving modes, and provides deterministic operation so as to avoid metastable states.

SUMMARY OF THE INVENTION

The invention is a frequency mode switching system for a microprocessor that maintains phase lock in a phase-locked loop while switching clock frequencies. The frequency mode switching system receives a system clock signal at an input buffer. A first frequency shifter divides the system clock by a division ratio specified by the CPU, to produce a reference signal. The reference signal is coupled to a phase-locked loop (PLL) circuit. The phase-locked loop circuit has a voltage controlled oscillator (VCO) that outputs a signal at a normal operating frequency to a third frequency shifter. The third frequency shifter divides down the VCO output signal to produce a CPU clock signal. After passing through the CPU clock distribution network the CPU clock signal is coupled to a second frequency shifter which divides the CPU clock signal and outputs a feedback signal to the PLL circuit. The PLL circuit maintains phase and frequency lock between the feedback signal and the reference signal.

When the CPU provides a command signal to at least one of the frequency shifter circuits to change its frequency division ratio, the signal is detected by a comparator which compares the current frequency division ratio of each of the frequency shifters to the CPU frequency command signal for each frequency shifter. The comparator outputs a reload signal to a synchronizer circuit. The synchronizer circuit aligns the reload signal to the VCO output signal and selects the appropriate VCO output cycles that the division ratio of each of the frequency shifters should be updated on. To maintain phase-lock the third frequency shifter division ratio is updated first. The third frequency shifter division ratio update is also timed so that the start of the first new clock frequency cycle is aligned with the start of a reference clock cycle. The first and second frequency shifters are then updated after a delay based on the delay of the CPU clock distribution network to enable the PLL to maintain phase lock between the reference signal and feedback signal inputs. The invention thus maintains phase lock while changing clock frequency operating modes which provides deterministic operation and avoids metastability. The invention further provides for rapid switching from a normal operating mode to a reduced frequency mode and back to normal. For example, one embodiment can switch from a normal operating mode to a reduced frequency mode and back to normal in 4 CPU clock cycles.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DESCRIPTION OF THE PREFERRED EMBODIMENTS

Figure 1:
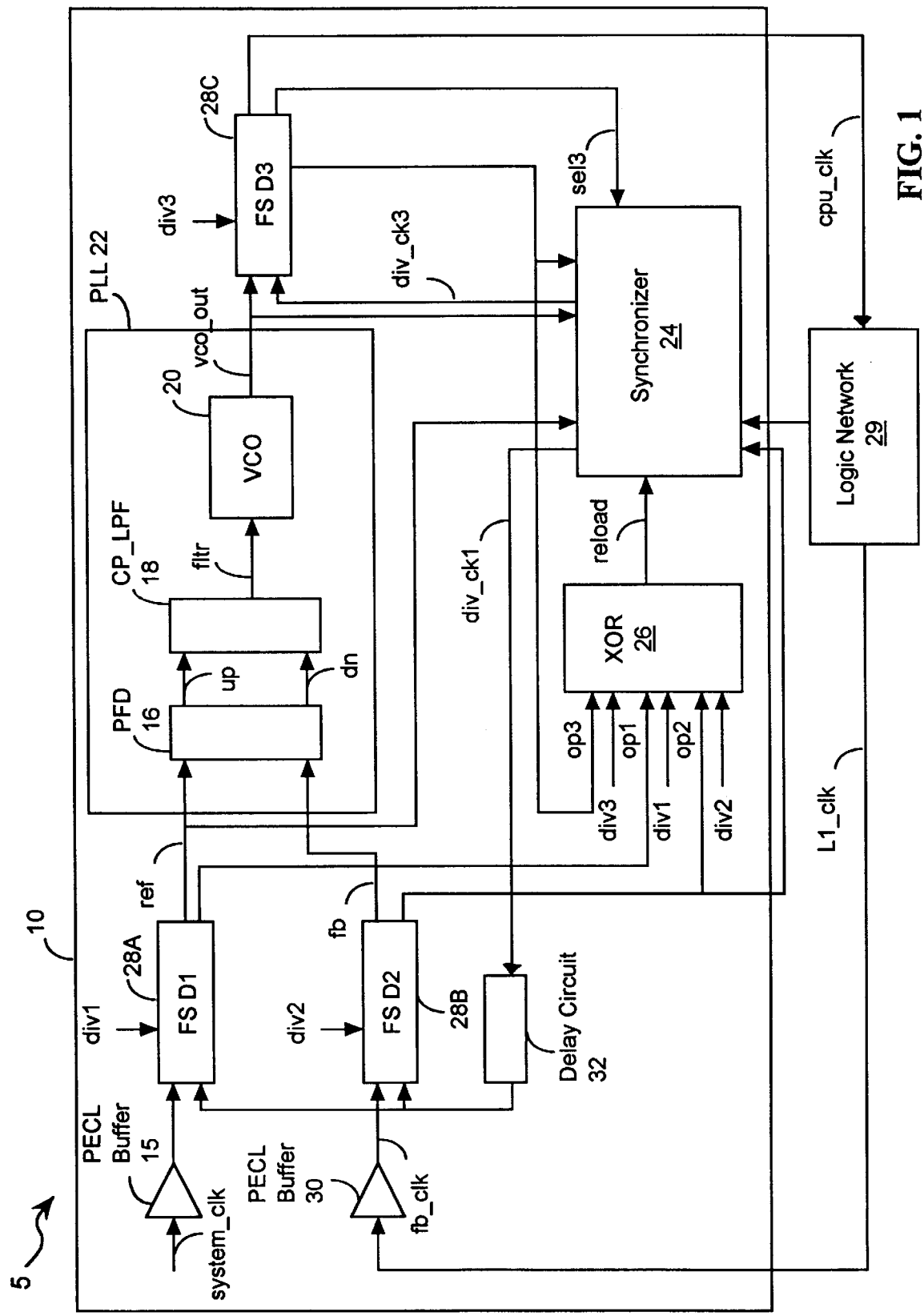
FIG. 1 illustrates a block diagram of a microprocessor that includes a clock frequency mode switching system according to an embodiment of the invention.

Referring to FIG. 1, there is shown a block diagram of a microprocessor that includes a clock frequency mode switching system 10 according to one embodiment of the invention. The frequency mode switching system 10 maintains phase lock in a phase-locked loop while switching from a normal operating mode to a reduced frequency mode and back to normal. In one embodiment the frequency mode switching system 10 is implemented to enable the system to switch between normal and "Energy Star" operating modes. The invention optimizes the use of available edges for phase comparison and eliminates metastability.

Frequency mode switching system 10 includes three frequency shifter circuits frequency shifter D1 28A, frequency shifter D2 28B, frequency shifter D3 28C, a phase-locked loop (PLL) 22, logic network 29 and synchronizer circuit 24. In a preferred embodiment frequency mode switching system 10 is incorporated in a microprocessor, and logic network 29 represents the logic circuitry of the microprocessor. PLL 22 includes phase frequency detector 16, a charge pump-low pass filter (CP-LPF) 18, a voltage controlled oscillator VCO 20. PLL 22 aligns the L1_clk signal which is the output clock from logic network 29 with the external system clock, system_clk, which is provided to PECL buffer 15. Switching synchronization is based on the timing requirements at the different stages of the system. The latching of the clock frequency division ratio is synchronized to the VCO at frequency shifter D3, while frequency shifter D1 and frequency shifter D2 are synchronized to the fb_clk clock signal. The frequency shifter circuits switch modes based on the div_ck1 and div_ck3 signals.

The clock signal frequencies are related by the equations:

$$f_{vco} = f_{system}\left[\frac{D_2 * D_3}{D_1}\right]$$

$$f_{cpu} = f_{system}\frac{D_2}{D_1}$$

where $f_{cpu}$ is the frequency of the CPU (logic network 29) clock signal, $f_{vco}$ is the frequency of the VCO output signal, and $D_1$, $D_2$ and $D_3$ are the division ratios of frequency shifters D1–D3.

In "energy Star" compliant power saving frequency modes the $cpu_{13}$ clk frequency is reduced to a fraction of the normal operating frequency. For example, one embodiment supports $cpu_{13}$ clk frequencies of ½,¹⁄₁₆,¹⁄₃₀ and ¹⁄₃₂ of the normal operating speed. VCO 20 operates continuously at the normal operating frequency, independent of the frequency mode. The VCO frequency is typically set for a particular system hardware implementation and is thereafter fixed. In one embodiment the system can switch from a normal operating mode to a reduced frequency mode and back to normal in 4 CPU clock cycles.

To maintain phase lock when the $cpu_{13}$clk frequency is changed the frequency shifter D3 is updated first. Frequency shifters D1 and D2 are then updated after a predetermined delay, based on the delay in logic network 29, so that the feedback clock frequency signal, fb, remains synchronized with the reference signal, ref.

In operation, the $system_{13}$clk signal is provided as an input to PECL buffer 15. PECL buffer 15 converts the ECL $system_{13}$clk voltage levels with a swing of 0.8 V to 1.6 V to the CMOS logic levels which the frequency mode switching system 10 operates on. In one embodiment, the nominal frequency mode switching system 10 logic levels are 0 V to 1.8 V. PECL buffer 15 outputs the $system_{13}$clk signal to the frequency shifter D1 circuit. The frequency shifter D1 circuit divides the $system_{13}$clk according to a division ratio specified by the div1 frequency ratio control signal. The ref clock output signal from frequency shifter D1 is the divided down clock signal.

Phase Frequency Detector 16 has two inputs: the ref clock signal and the feedback clock signal fb. Phase Frequency Detector 16 compares the ref and fb signals to determine whether they are aligned. When the frequency mode switching system 10 is powered up, the PLL is out of lock and the ref and fb signals are not aligned. In one embodiment, default division ratio values are provided to the frequency shifters D1–D3 when the system is powered up to facilitate obtaining phase lock rapidly. Phase Frequency Detector 16 outputs either an up signal or a down signal to the charge pump low pass filter CP-LPF circuit 18, as appropriate based on the comparison of the fb and ref clock signals. CP-LPF 18 then increases or decreases the charge pump voltage which is coupled to VCO 20 via the fltr signal. The fltr signal thereby controls the VCO 20 frequency.

The VCO 20 is frequently used to generate an output signal at a higher frequency than the reference signal. When this is done, the frequency must be reduced at the input side of the phase frequency detector 16 so that it matches the frequency of the reference signal. Frequency shifters 28 are used to accommodate this type of operation. The VCO 20 frequency only changes when the PLL 22 is out of lock. In typical operation, the system is only out of lock for a brief time after the system is turned on. After the system is powered-up and locked, the cpu_clk frequency can be changed to different ratios of the VCO clock to conserve power.

Frequency shifter D3 divides the VCO frequency by the D3 denominator as defined by the div3 control signal. The frequency shifter D3 provides the resultant cpu_clk clock signal to the logic network 29. The output clock signal from the logic network is L1_clk. L1_clk is coupled through PECL buffer 30 to match the system_clk delay and is divided by the D2 division ratio in the frequency shifter D2 circuit to complete the clock feedback loop.

XOR unit 26 is a comparator that detects changes in the clock frequency command signals div1, div2 and div3. XOR unit 26 has two inputs for each of the frequency shifters. The first input, for example op1, indicates the current clock frequency division ratio of the corresponding frequency shifter, in this case frequency shifter D1. The second input, for example div1, provides the command from the logic network 29 to set the clock frequency division ratio for the frequency shifter. When the logic network 29 changes the clock frequency division ratio for at least one of the frequency shifter circuits, one of the input pairs of XOR unit 26 will not match and XOR unit 26 switches the reload output signal high The reload signal is coupled to synchronizer 24.

Synchronizer 24 synchronizes the frequency ratio update signal with the vco_out signal and selects the appropriate vco_out signal to output the div_ck3 frequency ratio update signal so that the first cpu_clk frequency cycle at the new frequency is aligned with the ref signal and has the correct period. To provide this frequency ratio update signal, synchronizer 24 first approximately aligns the reload signal from XOR unit 26 with the vco_out. Synchronizer 24 also selects the appropriate vco_out signal cycle to output the div_ck3 frequency ratio update signal to frequency shifter D3 so that the first cycle of the new frequency shifter D3 output signal is appropriately aligned with a ref signal cycle such that when the cpu_clk signal is fed back to the PLL circuit 22 the fb_clk and ref signals are aligned. Similarly, synchronizer circuit 24 subsequently outputs the div_ck1 frequency update signal to update frequency ratios of frequency shifters D1 and D2. In one embodiment, the delay between when the div_ck3 frequency ratio update signal is provided to frequency shifter D3 and when the frequency shifters D1–D3 have all updated their frequency ratios is 2 CPU cycles. This delay depends in part on the delay of logic network 29.

The operation of frequency shifters D1–D3 is more fully appreciated with reference to some specific examples. Assume that the off-chip clock signal is at 150 MHz and the logic network 29 operates at 600 MHz. In this case, the frequency shifter D1 must replicate the off-chip clock signal by dividing by a frequency shift factor of 1 (N=1). The VCO 20 produces an output signal at 600 MHZ. Since the logic network 29 is operating at 600 MHZ, the frequency shifter D3 reproduces the signal from the VCO 20 by dividing by a frequency shift factor of 1 (N=1). The feedback signal from the logic network 29 is at 600 MHZ, but must be shifted so that it matches the 150 MHZ signal from the off-chip clock signal. Thus, the frequency shifter D2 divides the 600 MHZ signal by a frequency shift factor of 4 (N=4).

The logic network 29 passes frequency command signals to each frequency shifter 28. In the present example, the logic network 29 sends a frequency command signal with a frequency shift factor of 1 to frequency shifter D1 using the div1 signal, a frequency command signal with a frequency shift factor of 4 to frequency shifter D2 using the div2 signal, and a frequency command signal with a frequency shift factor of 1 to frequency shifter D3 using the div3 signal.

In an alternate operational mode, if the logic network 29 is to operate at 150 MHZ, then the logic network 29 passes a frequency command signal with a frequency shift factor of 1 to frequency shifter D1 (to replicate the 150 MHZ off-chip clock signal), a frequency command signal with a frequency shift factor of 4 to the frequency shifter D3 (to divide the 600 MHZ clock signal from VCO 20 by 4), and a frequency command signal with a frequency shift factor of 1 to the frequency shifter D2 (to replicate the 150 MHZ logic network clock signal).

Thus, the frequency shifters 28 provide a mechanism that allows the logic network to use various clock frequencies, while the phase-locked loop 22 always processes clock signals at the same frequency.

Figure 2:
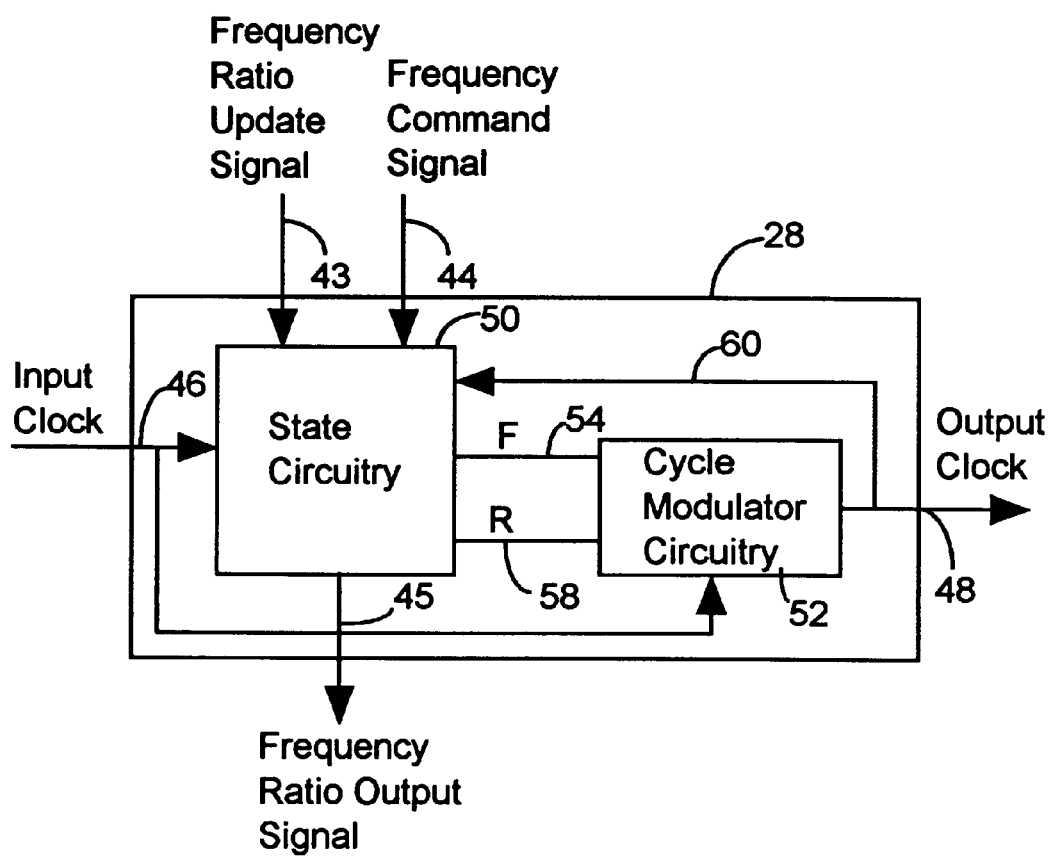
FIG. 2 illustrates a frequency shifter in accordance with an embodiment of the invention.

FIG. 2 illustrates a frequency shifter 28 in accordance with an embodiment of the invention. The frequency shifter 28 includes state circuitry 50 and cycle modulator circuitry 52. The state circuitry 50 receives an input clock signal on node 46 and a frequency command signal on node 44. The output of the state circuitry includes an "F" signal on node 54 and an "R" signal on node 58. The cycle modulator circuitry 52 is connected to the state circuitry 50 via nodes 54 and 58. The cycle modulator circuitry 52 generates a frequency shifted output signal on node 48 in accordance with the frequency shift factor of the frequency command signal. A feedback line 60 exists between the cycle modulator circuitry 52 and the state circuitry 50.

The frequency shifter 28 of the invention processes a multi-bit frequency command signal. The multi-bit frequency command signal has a frequency shift factor "m" (or otherwise called a division ratio). The modulation factor varies from 1 to N, as determined by "N" binary weighted programming bits, in the fashion $m=[n_{base2}+1]$. This means that N=[000000] results in a frequency shift factor of one (period multiplication of m=1; frequency division=1) and n=[1 1 1 1 1 1] results in a frequency shift factor of 64 (period multiplication of m=64; frequency division=64). When multiplying by a frequency shift factor of 1 (000000), the output clock replicates the input clock. When multiplying by a frequency shift factor greater than 1, the period of the input clock is multiplied by a value equivalent to the specified binary value plus one.

Figure 3:
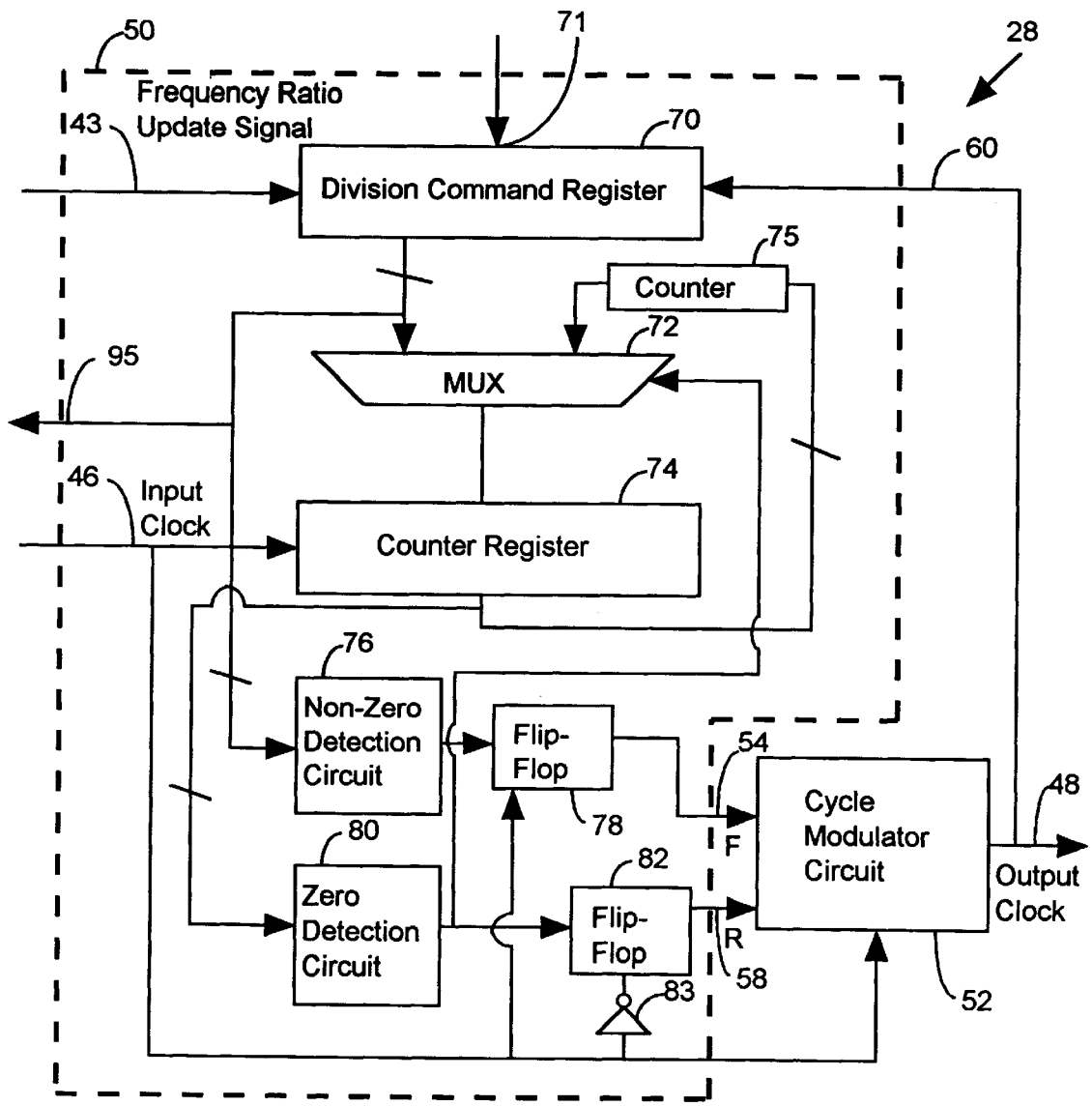
FIG. 3 illustrates state circuitry in accordance with an embodiment of the invention.

FIG. 3 illustrates state circuitry 50 in accordance with an embodiment of the invention. The state circuitry 50 includes a division command register 70. The division command register 70 is connected to a multi-bit digital port 71 that receives a multi-bit frequency command signal from the logic network 29. Similarly, multi-bit digital port 95 provides the frequency ratio output signal that indicates the current frequency of the frequency shifter output clock signal. By way of example, assume that the frequency command signal has a frequency shift factor of 1, meaning the output clock should replicate the input clock. This frequency shift factor may be represented by the digital value [000000], as discussed above. In such a case, a non-zero detection circuit 76 generates a false signal in the form of a digital low signal. This signal is latched through a flip-flop 78 and is then applied to the cycle modulator circuit 52 in the form of an "F" signal.

Relying upon the same example, the counter register 74 is initially empty and therefore is also at zero. Consequently, a zero detection circuit 80 generates a true signal in the form of a digital high signal. The digital high signal is latched through a flip-flop 82 and is then applied to the cycle modulator circuit 52 as an "R" signal. The output of the zero detection circuit 80 is also used as a-select signal for the multiplexer 72. When the output of the counter register 74 is zero, the zero detection circuit 80 generates a digital high select signal that causes the multiplexer 72 to load the counter register 74 with the signal in the division command register 70.

When the division command register 70 receives a non-zero frequency command signal, this value is loaded into the counter register 74. The non-zero value causes the zero detection circuit 80 to generate a digital low select signal for the multiplexer 72. Accordingly, the multiplexer 72 begins to load the counter register 74 with the output signal from a next-state count-down counter 75. The counter 75 is in the form of a down-counter. Thus, for each clock cycle, the counter 75 decrements the value it receives from the counter register 74. For example, assume that a frequency shift factor of 5 is received. In the previous example the digital signal of zero is equivalent to a frequency shift factor of 1, therefore a digital signal of four is equivalent to a frequency shift factor of 5. This digital signal is loaded into the counter register 74. The value is decremented by the counter 75 with each rising edge of the clock signal on node 46. When the signal is decremented, it produces a non-zero value which causes the zero detection circuit 80 to continue to generate a digital low select signal which causes the multiplexer 72 to load the decremented counter value back into the counter register 74.

This operation is repeated until the counter decrements the frequency command signal to zero. At this point, the zero detection circuit 80 once again generates a digital high signal, Sel, causing the multiplexer to load the counter register 74 with the signal from the division command register 70.

The non-zero detection circuit 76 is activated when the division command register 70 loads a non-zero value into the counter register 74. The activated non-zero detection circuit results in an "F" signal with a digital high state. After the non-zero value is loaded into the counter register 74, the non-zero detection circuit 76 receives zero value inputs from the division command register 71. Thus, the "F" signal returns to a digital low state. Consequently, the "F" signal can be thought of as a count initiation signal that is operative (digitally high) during the initiation of the count state.

The zero detection circuit 80 forces the "R" signal to a digital low state while the counter 74 is operating to decrement a non-zero frequency command signal. When the counting is completed, the "R" signal is in a digital high state. Thus, the "R" signal can be thought of as a reset signal that is active during a non-count state.

The cycle modulator circuit 52 processes the "F" and "R" signals from the state circuitry 50 to produce a frequency shifted output signal. In general terms, when activated with a frequency shift factor greater than 1, the cycle modulator circuit 52 initially holds the output clock signal in a first digital state (e.g., high) for one input clock cycle. Thereafter, it holds the output clock signal in a second digital state (e.g., low) until the specified frequency shift factor value is reached. For example, if the frequency shift factor is 5, then the resultant frequency shifted signal will have a digital high value for one input clock cycle and a digital low value for four input clock cycles. The output clock signal is frequency shifted according to the frequency shift factor loaded into the counter 74.

The frequency command signal results in a frequency shifted clock signal within one input clock cycle. That is, the frequency shifter has a latency of less than one input clock cycle. In the example above, the frequency command signal was captured into the division command register during the second input clock cycle. The frequency command signal was then loaded into the counter register 74 during the third input clock cycle. The output clock cycle did not end until the start of the eighth input clock cycle.

Observe that the rise time delay at the beginning of the divided clock cycle will always be the same. Note also that the frequency shifter 28 can process a frequency command signal with any value. Thus, frequency shift factors of 1 and 2 are possible. Advantageously, identical frequency shifters 28 are used throughout the microprocessor 5.

Figure 4:
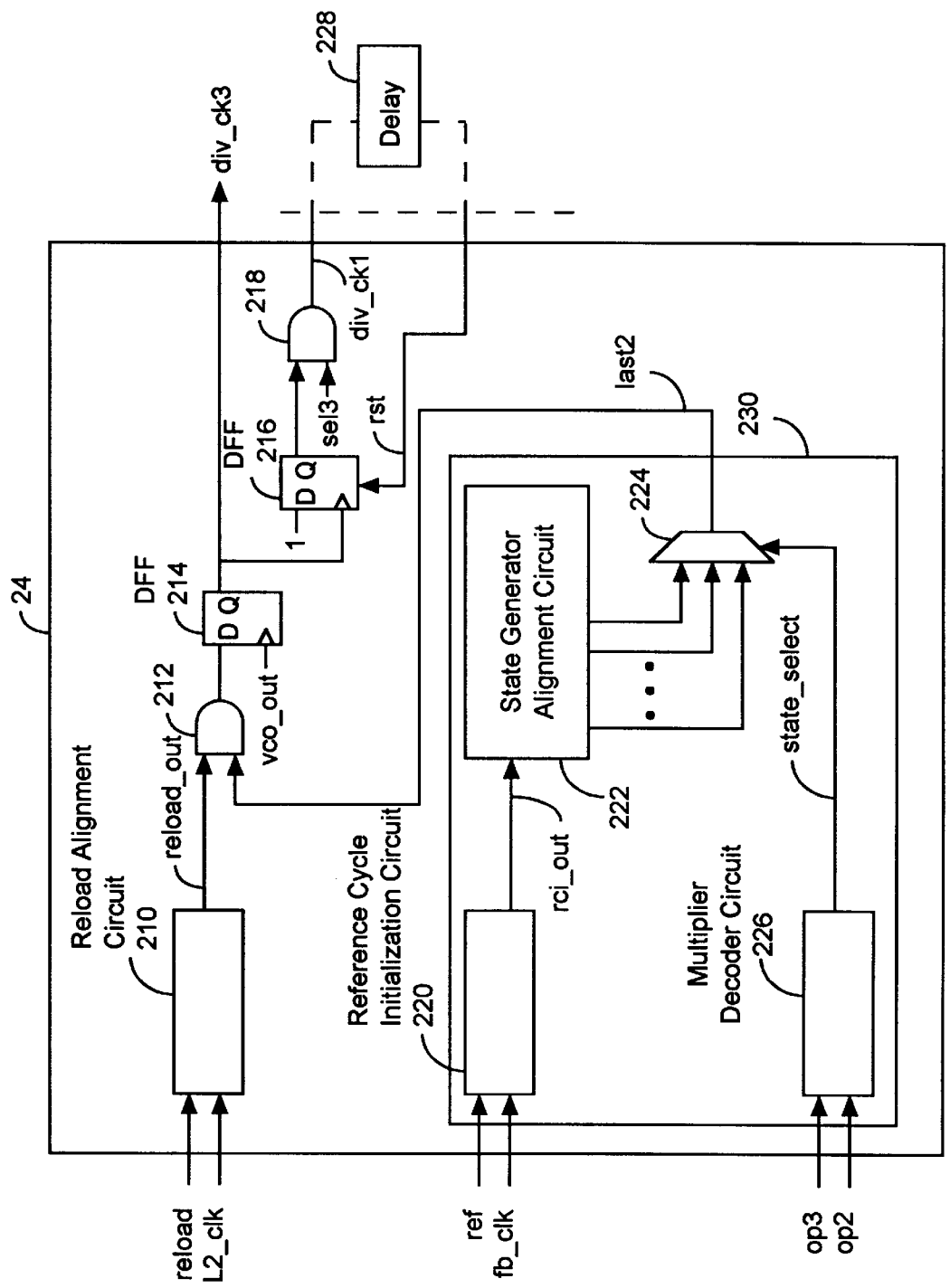
FIG. 4 illustrates a block diagram of a synchronizer circuit according to an embodiment of the invention.
Figure 5:
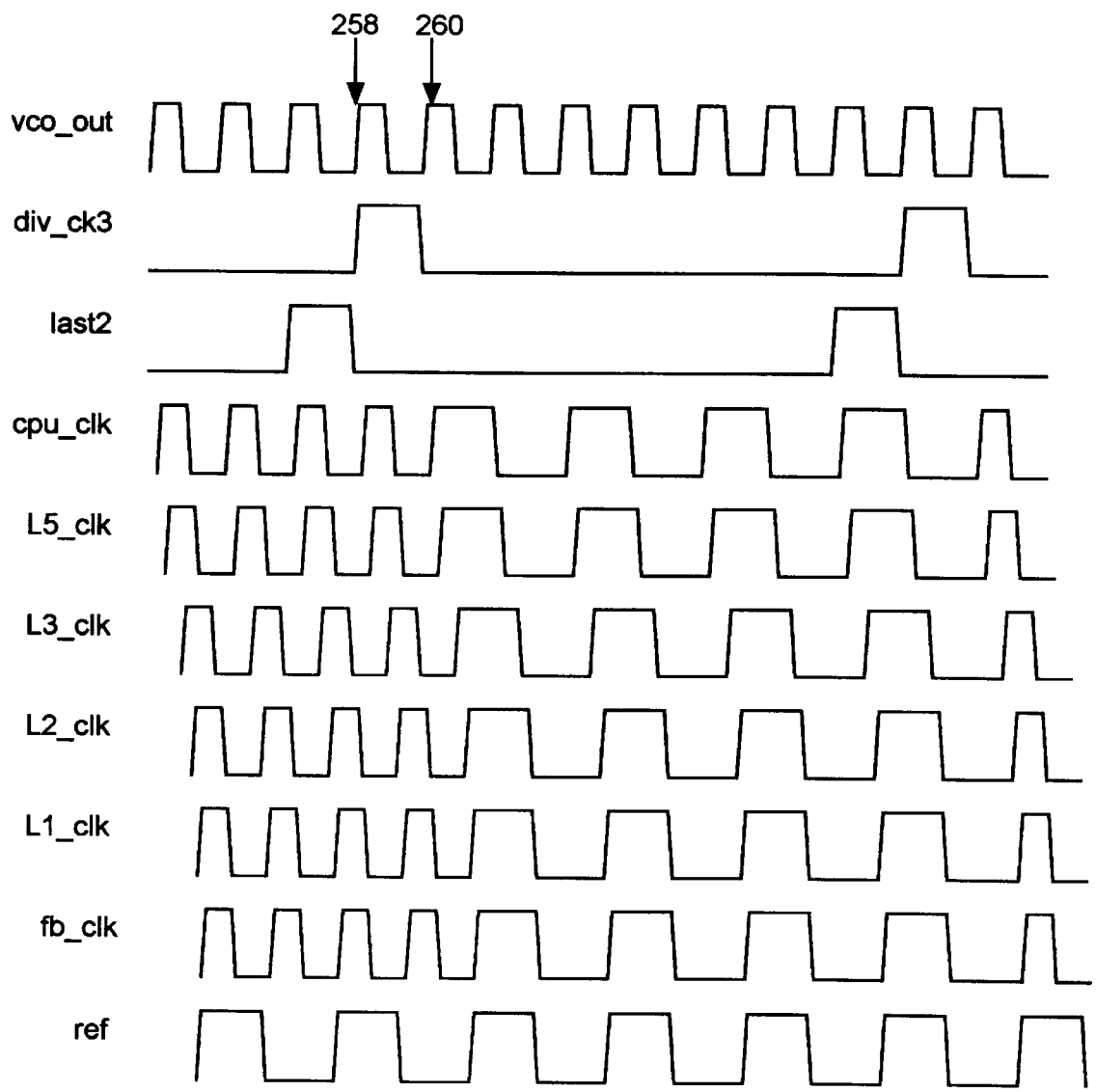
FIG. 5 depicts a timing diagram illustrating the operation of a synchronizer circuit according to an embodiment of the invention.

FIG. 4 illustrates a block diagram of synchronizer circuit 24. A timing diagram illustrating the operation of synchronizer circuit 24 is shown in FIG. 5. Synchronizer circuit 24 aligns the reload signal with the vco_out signal and outputs the div_ck3 division ratio update signal so that the division ratio change is aligned with the ref clock, such that the rising edges of the ref clock and fb_clk signals are aligned at the input of PLL 22. Observe that, for example, that ref clock may be operating at a small fraction of the VCO frequency such as 1/30.

Reload alignment circuit 210 approximately aligns the reload signal to the vco_out signal. When XOR unit 26 detects that the division ratio of one of the three frequency shifters D1–D3 does not match the division ratio provided by logic network 29, XOR circuit 26 sets the reload output signal high which indicates that a clock frequency division ratio has to be updated. The reload alignment circuit 210 uses the L2_clk clock signal, which is an earlier version of the L1_clk, as shown in FIG. 5. Therefore the reload signal needs to be re-aligned so that it can be used with the vco_out signal without violating setup time requirements or entering a metastable state. The vco_out signal is ahead of the L2_clk. The reload signal is re-aligned by the reload alignment circuit 210 to approximately align the reload_out signal to the vco_out signal. The final alignment of reload signal with the vco_out signal is provided by flip-flop DFF 214.

Figure 6:
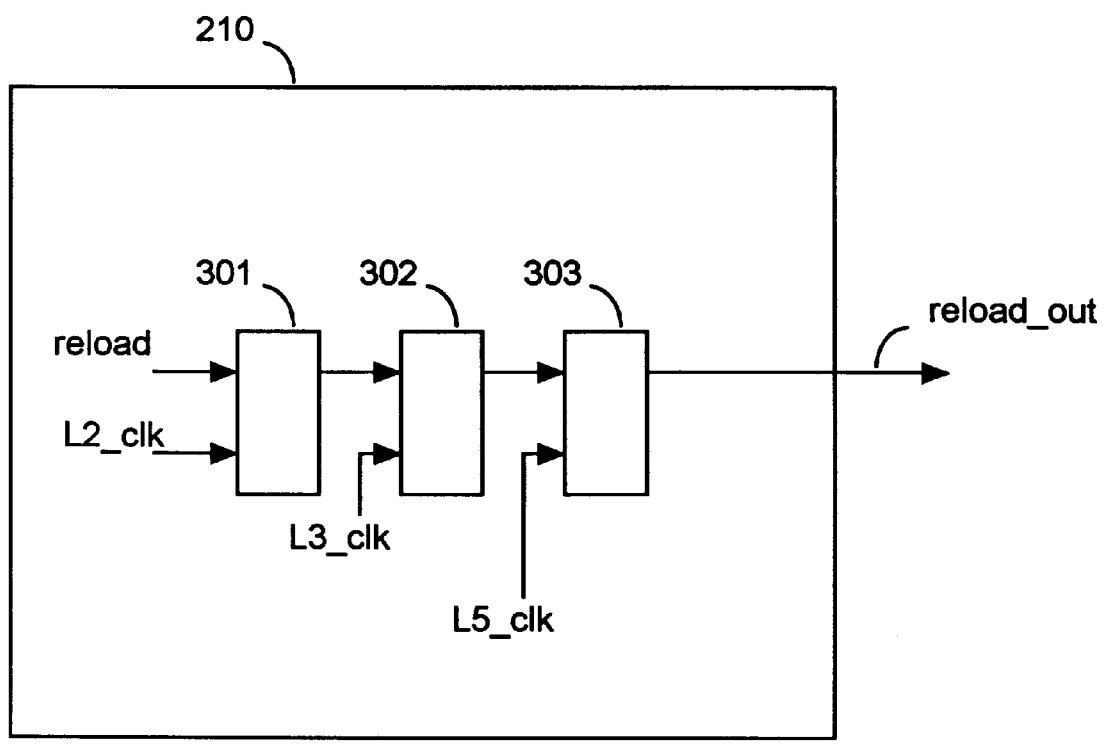
FIG. 6 illustrates a block diagram a reload alignment circuit according to an embodiment of the invention.

FIG. 6 illustrates a block diagram of one embodiment of the reload alignment circuit 210. The reload signal is re-aligned using the series of flip-flops 301–303. As illustrated in FIG. 5, the clocks L2_clk, L3_clk and L5_clk for each flip-flop are delayed with respect to the preceding stage. In this manner the output of each flip-flop is incrementally shifted by each stage. Each stage shifts the reload signal less than one cpu_clk signal cycle to avoid violating setup time requirements. The reload alignment circuit aligns the reload signal with the L5_clk, which as shown in FIG. 5, is very close to being aligned with the vco_out signal. In this embodiment, the L5_clk is sufficiently close to the vco_out signal to guarantee that the reload_out signal will not violate the timing requirements of the input to DFF 214 with respect to the vco_out clock signal. In an alternative embodiment, another flip-flop stage can be added that is clocked by the vco_out signal to align the reload signal with vco_out.

Update cycle selection circuit 230 is directed to identifying the vco_out signal cycle to select to clock the div_ck3 signal such that frequency shifter D3 aligns the updated frequency cpu_clk signal with the ref clock signal so that the fb_clk signal and ref clock signal rising edges are aligned at the PLL 22 inputs, as illustrated in FIG. 5 at time 260. The update cycle selection circuit 230 includes the reference cycle initialization circuit 220, multiplier decoder circuit 226, and state generator alignment circuit 222. To identify the appropriate vco_out signal cycle, first the reference cycle initialization circuit 220 detects a falling edge of the fb_clk signal. The next rising edge of the ref signal after the falling fb_clk signal causes the reference cycle initialization circuit to output an active low pulse on signal rci_out. The rci out signal is used, rather than the ref signal, so as to provide a pulse with a one cpu_clk cycle duration to the state generator alignment circuit 222. The falling edge of the fb_clk signal is used to avoid metastability. As shown in FIG. 5, rising edges of the fb_clk signal, that correspond to the start of a ref signal cycle, are approximately aligned with rising edges of the ref signal. However, due to uncertainties in the timing of the circuit the fb_clk rising edge may be slightly ahead or behind the ref rising edge. Using the falling edge of fb_clk provides a half cycle phase delay which is more than adequate to avoid this potential clock jitter. Thus the rising edge of the ref signal after a fb_clk signal generates an active low pulse on signal rci_out which initiates the start of a count cycle for the state generator alignment circuit 222.

Figure 7:
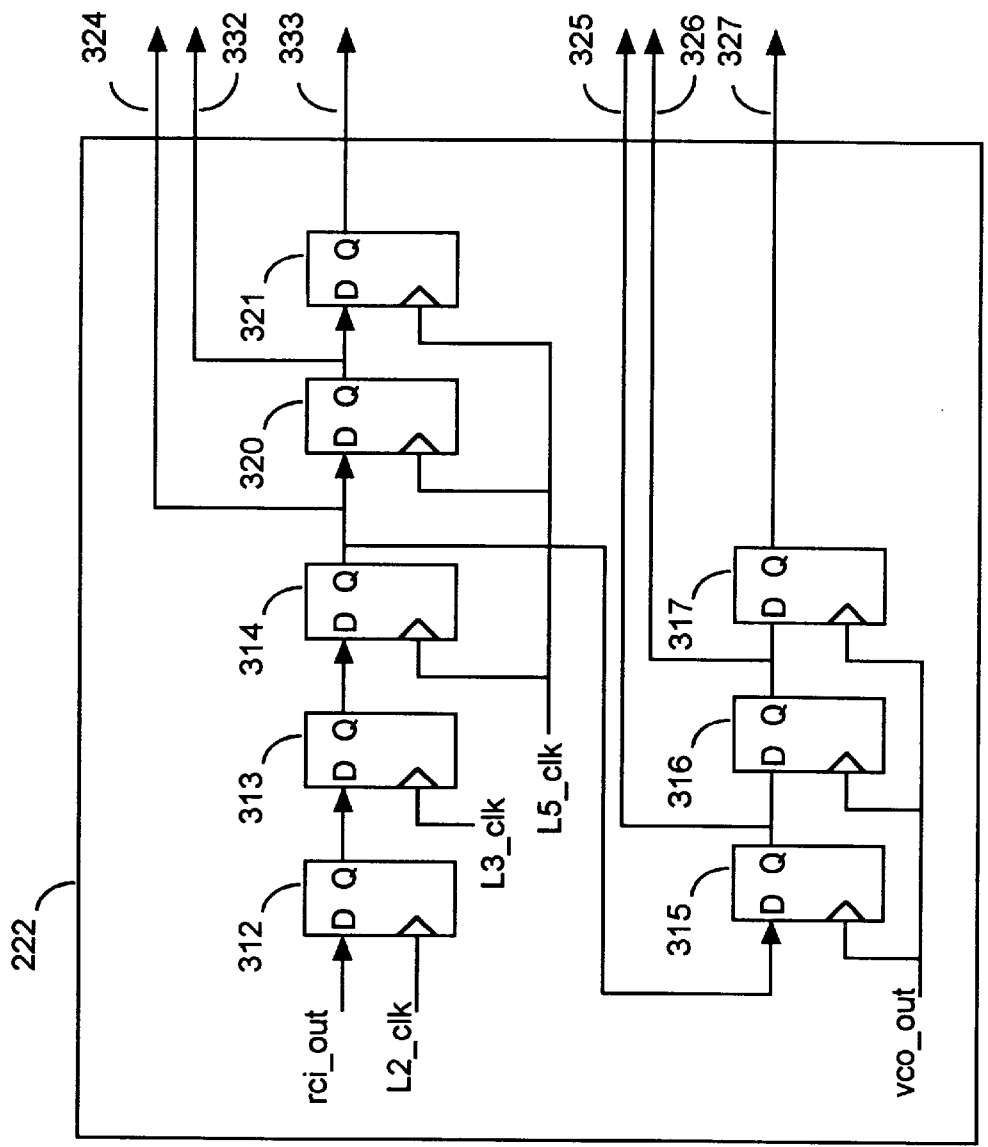
FIG. 7 illustrates a block diagram of a state generator alignment circuit according to an embodiment of the invention.

State generator alignment circuit 222 has two primary functions. First state generator alignment circuit 222 at least approximately aligns the rci_out signal with the vco_out signal, and second it splits the vco_out signal cycles into separate signal lines. These signal lines are provided as inputs to multiplexer 224. FIG. 7 illustrates a block diagram of the state generator alignment circuit. The state generator alignment circuit 222 is comprised of a pipeline of flip-flops 312–317,320 and 321. The rci_out signal from the reference cycle initiation circuit 220 is coupled to flip-flop 312. The rci_out signal initiates a new counting cycle. Flip-flops 312, 313 and 314 incrementally shift the rci_out signal to align the signal with the L5_clk signal. The L5_clk signal is in turn approximately aligned with the vco_out signal. The output signals 324,332 and 333 of flip-flops 314, 320 and 321 are each coupled to multiplexer 224. Each of these signals provides a different vco_out signal cycle that may be selected as the penultimate state cycle.

The shifted rci_out signal output from flip-flop 314 is coupled to flip-flop 315. Flip-flops 315–317 are clocked by vco_out. The output signals 325–327 of flip-flops 315–317 are also each coupled to multiplexer 224. Thus flip-flops 315–317 provide penultimate state signals that are aligned with the vco_out signal.

To select the appropriate vco_out signal cycle, multiplier decoder circuit 226 determines what the frequency multiplier between the ref clock signal and the cpu_clk signal is based on the op2 and op3 frequency ratio output signals which indicate the current frequency ratio of the output signal of the corresponding frequency shifter. To approximately align the first cycle of the new cpu_clk frequency with the start of a ref clock signal cycle, as shown in FIG. 5, the vco_out clock cycle selected from the state generator alignment circuit 222 is one less than a multiple of the division ratio. The number of cycles delay should be large enough to allow for a sufficient number of alignment stages in the reload alignment circuit 210 to align the reload signal with the vco_out signal. Therefore, in one embodiment, the seventh cycle is used when the system_clk to cpu_clk ratio is four. Based on this ratio the multiplier decoder circuit 226 selects an input to multiplexer 224 that corresponds to the penultimate vco_out cycle before the next system_clk rising edge. For example, where the cpu_clk to system_clk ratio is four, eight can be used as the multiple, and the state generator therefore effectively counts seven states before the last2 signal goes high. Alternatively the fifteenth cycle could also be used. The penultimate vco_out cycle starts at time 258 as shown in FIG. 5. The penultimate state vco_out signal is provided by multiplexer 224 to AND gate 212 via the last2 signal. Using a larger common multiple of the frequency ratio simplifies the logic circuitry of the update cycle selection circuit 230 by enabling more than one mode to use the same output signal from the state generator alignment circuit 222. For example, the fifteenth clock cycle can be used for frequency ratios of four, eight and sixteen.

The last 2 signal input to AND gate 212 determines the vco_out signal that the division ratio of frequency shifter D3 is updated on. The DFF 214 flip-flop is clocked by the vco_out signal to generate the div_ck3 division ratio update signal at time 258. Frequency shifter D3 receives the div_ck3 signal and updates the frequency of its cpu_clk output signal at the vco_out signal cycle which is also aligned with the start of a ref clock signal cycle. The cpu_clk signal is then provided to the logic network 29 at the new frequency.

The clock frequency division ratios for frequency shifters D1 and D2 are updated by the div_ck1 signal generated by AND gate 218. The div_ck3 signal is coupled to the clock input of flip-flop DFF 216. The data input of DFF 216 is hardwired to a logic one level, therefore the div_ck3 signal immediately passes through DFF 216 to AND gate 218. The DFF 216 output remains high until it is reset by the rst signal. The sel3 signal is provided by frequency shifter D3. Frequency shifter D3 outputs a pulse on the sel3 signal when it has completed its count, as shown at time 258 in FIG. 5. The division ratio of a frequency shifter is updated at the start of the frequency shifter count so that the first clock cycle of the new frequency is accurate. When the division ratio of frequency shifter D3 is one, the sel3 signal is always set high because each vco_out cycle corresponds to the start of a new single count frequency shifter D3 cycle.

In operational modes where the ref signal and the cpu_clk signal are at the same frequency then the frequency shifters D1–D3 can all be updated at the same time because all of the frequency shifters start their count cycles at the same time and they will not latch in the new division ratio until they have completed their count cycle. Therefore in these operational modes, there is no need to wait for the penultimate state, rather the frequency shifter division ratio update signals can be provided early, relying on the frequency shifter counters to provide the required delay. For example in one embodiment, the fifth clock cycle is selected by multiplexer 224 when the vco_out to cpu_clk ratio is 16:1 and when the vco_out to cpu_clk ratio is 32:1 because in both of these cases the cpu_clk and ref frequencies are the same and therefore the frequency shifter update signals can be sent out before the normal "penultimate state" delay.

The div_ck1 output of AND gate 218 is routed through delay 228 and then resets the DFF 216 output low so that DFF 216 is ready for the next clock frequency mode change. Delay 228 thereby sets the DFF 216 pulse width. As shown in FIG. 1, the div_ck1 signal is also coupled through delay 32 to frequency shifters D1 and D2. Delay 32 matches the delay of logic network 29 to maintain the proper timing relationship between the fb_clk signal and the div_ck1 frequency update signal.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A clock frequency mode switching system comprising:
    a first frequency shifter circuit having an input node and an output node;
    a phase-locked loop (PLL) circuit having a first input node, a second input node and an output node, the first input node coupled to the first frequency shifter output node;
    a second frequency shifter circuit having an input node and an output node, the second frequency shifter output node coupled to the PLL circuit second input node;
    a third frequency shifter circuit having an input node and an output node, the third frequency shifter input node coupled to the PLL circuit output node;
    a synchronizer circuit, coupled to the PLL circuit, the first frequency shifter, the second frequency shifter and the third frequency shifter, to align a frequency update signal with respect to a PLL circuit output signal and subsequently to utilize said frequency update signal to align a logic circuit clock signal with respect to a reference clock signal.

2. The system of claim 1 wherein the third frequency shifter produces the logic circuit clock signal at the third frequency shifter output node, and wherein the synchronizer circuit, in response to a frequency command signal, changes the frequency of the logic circuit clock signal while the PLL circuit maintains phase lock between signals at the first and second PLL circuit input nodes.

3. The system of claim 2 wherein the synchronizer circuit further comprises an update cycle selection circuit for selecting a PLL circuit output signal cycle on which to provide the frequency update signal to the third frequency shifter after the frequency update signal has been aligned to the PLL circuit output signal.

4. The system of claim 3 wherein the update cycle selection circuit selects the PLL circuit output signal cycle such that the initial updated cycle of the logic circuit clock signal is aligned with respect to the start of a cycle of the reference clock signal.

5. The system of claim 4 wherein the update cycle selection circuit further comprises a reference cycle initiation circuit to detect a falling edge of an initiation signal, to detect a subsequent rising edge of the reference clock signal and to output a count signal.

6. The system of claim 5 wherein the update cycle selection circuit further comprises a state generator circuit to approximately align the count signal with the PLL circuit output signal and to provide a plurality of output signals each corresponding to a cycle of the PLL circuit output signal.

7. The system of claim 6 wherein the update cycle selection circuit further comprises a multiplier decoder circuit to decode a frequency ratio output signal, that represents an output signal frequency of one of the frequency shifter circuits, to determine the PLL circuit output signal cycle to select.

8. The system of claim 6 wherein the update cycle selection circuit selects a single PLL circuit output signal cycle for a plurality of logic circuit clock signal frequency ratios, wherein the PLL circuit output signal cycle number is derived from a common multiple of the logic circuit clock signals frequency ratios.

9. The system of claim 8 wherein, when the logic circuit clock signal frequency is equal to the reference clock signal frequency, the update cycle selection circuit selects a PLL circuit output signal cycle less than a first number of PLL circuit output signal cycles after a first logic state of the count signal, wherein the first number of PLL circuit output signal cycles is the value of the ratio of the PLL circuit output signal frequency to the logic circuit clock signal frequency.

10. The system of claim 4 further comprising a reload alignment circuit to approximately align a frequency ratio reload signal with the PLL circuit output signal.

11. The system of claim 10 where the reload alignment circuit further comprising a plurality of flip-flops coupled in series and a plurality of delayed flip-flop clock signal nodes coupled to the flip-flops, such that each of the plurality of flip-flops shifts the alignment of the frequency ratio reload signal with respect to the PLL circuit output signal.

12. The system of claim 11 further comprising a comparator coupled to the synchronizer circuit to compare a frequency command signal with a frequency ratio output signal, and to output the reload signal to the synchronizer circuit when the frequency command signal does not equal the frequency ratio output signal.

13. A method of switching clock frequency modes comprising the steps of:
receiving a frequency command signal that controls an output frequency of a frequency shifter circuit;
comparing the frequency command signal to a frequency ratio output signal, wherein when the frequency command signal does not equal the frequency ratio output signal:
generating a frequency ratio reload signal;
selecting a cycle of a phase-locked loop (PLL) signal to update the frequency of the frequency shifter circuit; and
providing a frequency update signal to the frequency shifter circuit on the selected PLL signal cycle, wherein the frequency update signal is aligned with respect to the PLL signal, and wherein the first cycle of a frequency shifter output signal at an updated frequency is aligned with respect to the start of a cycle of a reference clock signal.

14. The method of claim 13 wherein a PLL circuit maintains phase lock when the frequency shifter output signal frequency is changed.

15. The method of claim 14 wherein the step of selecting a PLL signal cycle further comprises the steps of:
detecting a falling edge of an initiation signal and detecting a subsequent rising edge of the reference clock signal; and
outputting a count signal after detecting the rising edge of the reference clock signal.

16. The method of claim 15 wherein the step of selecting a PLL signal cycle further comprises the steps of:
approximately aligning the count signal with the PLL signal; and
generating a plurality of output signals each corresponding to a cycle of the PLL signal.

17. The method of claim 16 wherein the step of selecting a PLL signal cycle further comprises the step of decoding a frequency ratio output signal that represents an output signal frequency of the frequency shifter circuit and determines the PLL signal cycle that is selected.

18. The method of claim 17 wherein in the step of selecting a PLL signal cycle a single PLL signal cycle is selected for a plurality of frequency shifter output signal frequency ratios, wherein the PLL signal cycle number is derived from a common multiple of the frequency shifter output signals frequency ratios.

19. The method of claim 18 wherein the step of selecting a PLL signal cycle further comprises, when the frequency shifter output signal frequency is equal to the reference clock signal frequency, selecting a PLL signal cycle less than a first number of PLL signal cycles after a first logic state of the count signal, wherein the first number of PLL signal cycles is the value of the ratio of the PLL signal frequency to the frequency shifter output signal frequency.

* * * * *